United States Patent
Zhou et al.

[19]
[11] Patent Number: 6,039,806
[45] Date of Patent: Mar. 21, 2000

[54] PRECISION THICKNESS OPTICAL COATING SYSTEM AND METHOD OF OPERATION THEREOF

[75] Inventors: Ming Zhou; Feng Qing Zhou, both of San Jose; Jing-Jong Pan, Milpitas, all of Calif.

[73] Assignee: E-Tek Dynamics, Inc., San Jose, Calif.

[21] Appl. No.: 09/063,147

[22] Filed: Apr. 20, 1998

[51] Int. Cl.[7] .......................... C23C 14/30; C23C 14/34; C23C 16/48; C23C 16/52

[52] U.S. Cl. ..................... 118/665; 118/50.1; 118/678; 118/712; 118/723 EB; 118/730; 204/298.03; 204/298.28; 356/382; 356/435

[58] Field of Search .................. 118/50.1, 665, 118/678, 712, 723 EB, 730; 204/298.03, 298.28; 356/382, 435

[56] References Cited

U.S. PATENT DOCUMENTS

| | | |
|---|---|---|
| 3,892,490 | 7/1975 | Uetsuki et al. ............... 356/382 X |
| 4,140,078 | 2/1979 | Wilmanns ...................... 118/665 |
| 4,311,725 | 1/1982 | Holland ........................ 118/665 X |
| 5,359,683 | 10/1994 | Pan . |

*Primary Examiner*—Leo B. Tentoni
*Attorney, Agent, or Firm*—Townsend and Townsend and Crew LLP

[57] ABSTRACT

The present invention provides for a system for the precision optical coating of substrates and a method of operating the system. The system has a vacuum chamber, a plasma source in the vacuum chamber, a plurality of e-beam evaporation units which generate a vapor of optical coating material in the vacuum chamber, and a plurality of stations, each station holding one substrate and rotating the substrate during deposition of the optical coating material upon the substrate. Each of the stations has an optical monitoring unit which monitors in situ the deposition of the optical coating material upon the corresponding substrate. With the described system, high production rates of precision optical elements, such as narrow bandpass optical filters, can be achieved.

31 Claims, 5 Drawing Sheets

PRECISION THICKNESS OPTICAL COATING SYSTEM AND METHOD OF OPERATION THEREOF

BACKGROUND OF THE INVENTION

The present invention is related to optical coating equipment and, more particularly, to systems for depositing optical coatings on optical substrates at very precise and controlled thicknesses.

Many optical elements are typically covered with thin-film optical coatings to either increase the transmissivity or the reflectivity of light through the elements to increase the performance of the elements. Even the lenses of most eyeglasses have optical coatings for better visibility. From the nature of light, the thickness of the coatings should be precise and uniform.

Optical coating systems rely upon a variety of techniques, such as sputtering (e.g., rf), and evaporation (e.g., resistance heating, e-beam, rf inductive heating) depending upon the requirements of the coating process. Where high volume production is required, the coating system can operate with a technique suitable for a large number of substrates. Where precision is required, the system operates with a technique by which the coating process can be carefully controlled and reliably duplicated. Heretofore, as one might expect, optical coating systems with high volume capabilities have not been capable of high precision, nor has the reverse been true.

One optical element which requires extremely precise and controlled optical coatings is the multicoated narrow bandpass filter suitable for the WDM (Wavelength Division Multiplexing) network, or the newer Dense WDM (Dense Wavelength Division Multiplexing) network. In such fiberoptic networks, the wavelength of a light signal directs the signal from a source toward one or more destinations. By the DWDM network standard, communication channels have a wavelength separation of only 0.8 nm (or a frequency separation of 100 GHz). Hence a wavelength filter must be extremely discriminating. For a narrow bandpass filter formed by multiple coatings on a substrate, the manufacturing requirements are quite severe. Such filters typically have coatings from 85–125 layers, with minimal variations in thickness distribution for each layer. As expected, the cost of these elements is quite high, well over one hundred U.S. dollars per filter element at the present. For a fiberoptic network having hundreds, if not thousands, of WDM coupler devices, each having such a filter as a component, the costs of these coupler devices alone become very high. Hence it is desirable that the costs of manufacturing precision coated optical elements, such as narrow bandpass filters, Rugate filters, dichroic filters and the like, be lowered.

Toward this end, the present invention is directed toward improved precision optical coating systems and methods of operation, which are capable of production at volumes much higher than found heretofore. Furthermore, the present invention also provides the improvements in the control and precision in the deposition of the optical coatings for improved optical performances by the resulting optical elements.

SUMMARY OF THE INVENTION

The present invention provides for a system for the optical coating of substrates with precision. The system has a vacuum chamber, at least one optical coating material source which generates a vapor of the optical coating material in the vacuum chamber, and a plurality of stations, each station holding one substrate and rotating the substrate during deposition of the optical coating material from the vapor upon the substrate. Each of the stations has an optical monitoring unit which monitors the deposition of the optical coating material upon the corresponding substrate. The optical monitoring unit comprises a source of light directed at a small portion of the substrate surface at zero angle of incidence to the substrate surface, and a receiver of the directed light. The substrate is arranged between the source of light and the receiver so that the receiver accepts the light during the deposition of the optical coating material upon the corresponding substrate for in-situ monitoring of the deposition process.

Furthermore, the present invention provides for a method of operating an optical coating system having a vacuum chamber, at least one source having a target of optical coating material, a plurality of substrate holding stations, and a plurality of optical monitoring units corresponding to each of the stations. The method has the steps of loading a substrate to each station; engaging each station to rotate a corresponding substrate; engaging the source to generate a vapor from a target of the optical coating material to deposit upon the rotating substrates; monitoring the deposition of the coating material upon each substrate; independently terminating the deposition of the coating material upon each substrate when the coating material reaches a predetermined thickness upon the substrate; determining when the coating materials upon all of the substrates have reached their predetermined thicknesses; and repeating the source engaging, deposition monitoring, independently terminating, and coating material thickness determining steps with another optical coating material.

DETAILED DESCRIPTION OF SPECIFIC EMBODIMENTS

Figure 1:
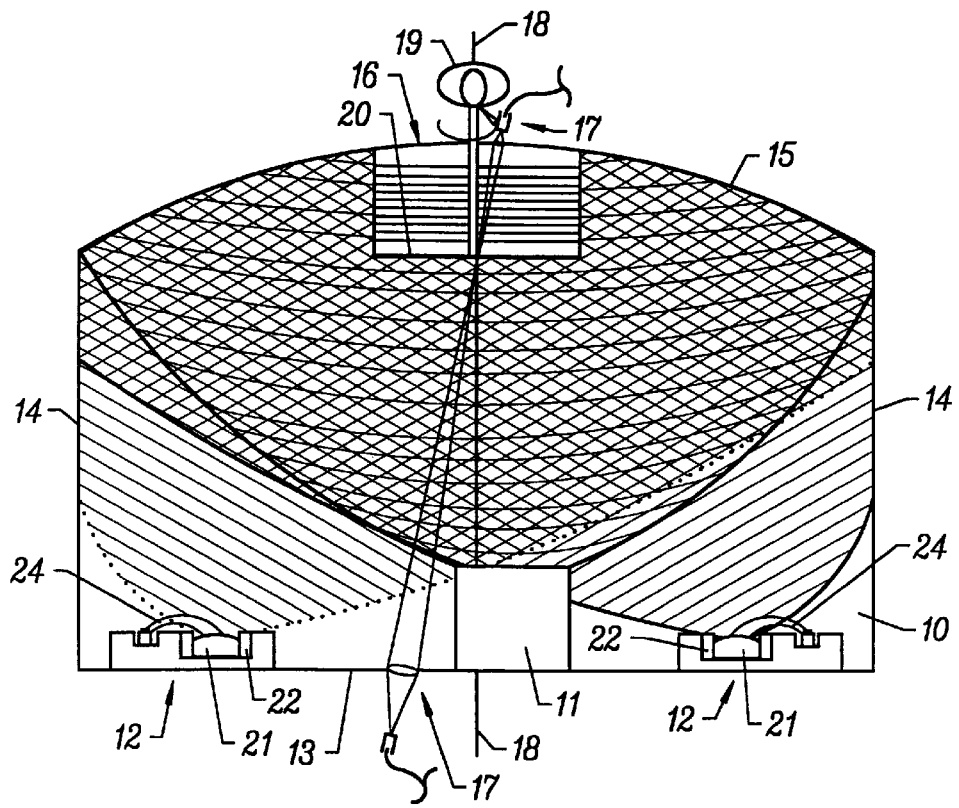
FIG. 1 is a representative cross-sectional view of a vacuum chamber of an optical coating system found in the prior art.

FIG. 1 illustrates the arrangement of one type of modern, high-performance optical coating system, a plasma-assisted e-beam evaporation optical coating system. The system has a vacuum chamber 10 formed with a base 13 upon which a plasma source 11 near the center of the base 13 and a plurality of e-beam evaporation units 12 around the periphery of the base 13 are mounted. A line 18 indicates the center axis of the chamber 10. Each e-beam evaporation unit 12 has a target 21 of solid optical coating material, such as $Ta_2O_5$ and $SiO_2$, in a crucible 22. During operation, each unit 12 generates an electron beam 24 which is magnetically deflected to the target 21 to cause optical material to "boil" off in a vapor. The material eventually deposits itself on the sides 14 and top 15 of the vacuum chamber 10. The plasma from the source 11 provides energy to the coating material vapor for a more solid, i.e., higher packing density, deposition of the coating material from the vapor onto a substrate. The shaded regions in FIG. 1 illustrate the general distribution of the optical material vapor from the e-beam evaporation units 12 and the plasma from the plasma source 11.

A substrate holding station 16 is mounted on the top 15 of the chamber 10. The station 16 holds a single substrate 20 which is to be coated. A drive unit 19 in the station 16 rotates the chuck holding the substrate 20 for a more even distribution of the optical material across the downward exposed substrate 20. Without rotation, variations in the thickness of the optical coating on the downward facing surface of the substrate 20 may occur across the entire surface of the substage 20. With rotation, the variations are radially symmetric about the axis of rotation, and decreased.

Figure 2:
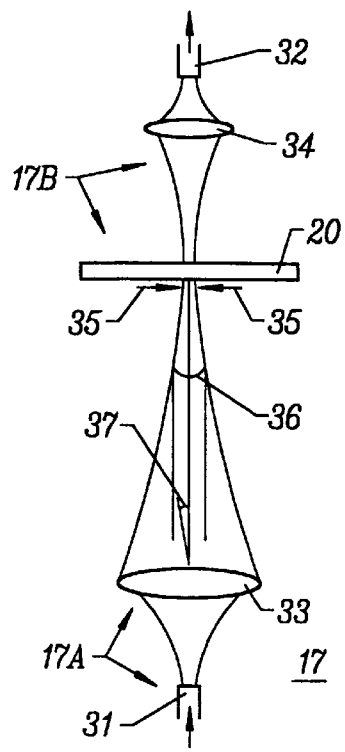
FIG. 2 is a detailed view of the light monitoring unit of the vacuum chamber of FIG. 1.

A light monitoring unit 17, which is illustrated in greater detail in FIG. 2, determines when the coating has reached the desired thickness. The monitoring unit 17 uses the transmission intensity of light at a single wavelength through the substrate 20 and the optical coating on the substrate to determine in-situ the thickness of the coating to a very precise degree. Interference from the multiple interfaces between the layers of deposited thin films on the substrate 20 affects the transmission, and reflection, of the monochromatic light.

A lower portion 17A of the unit 17, which transmits the light, is mounted to the base 13 of the chamber 10. That portion 17A has an end of an optical fiber 31, which is connected to a light source (shown in a later drawing). The end of the fiber 31 is arranged to direct light through a focusing lens 33 toward the substrate 20 and the top 15 of the chamber 10. After the light passes through the substrate 20, the light is received by an upper portion 17B of the light monitoring unit which is mounted to the chamber top 15. That portion 17B has a lens 34 which refocuses the light from the substrate 20 toward an end of an optical fiber 32 which carries the received light to a photodiode (not shown) to generate electrical signals which indicate when the deposited coating has reached the desired thickness and the coating process can be terminated.

The system described with respect to FIGS. 1 and 2 has been found to provide extremely accurate control of the thicknesses of the optical coatings. Nonetheless, production is slow; only one substrate is coated at a time. For a narrow bandpass filter with over one hundred coatings, production of one substrate can take over 20 hours.

Figure 3:
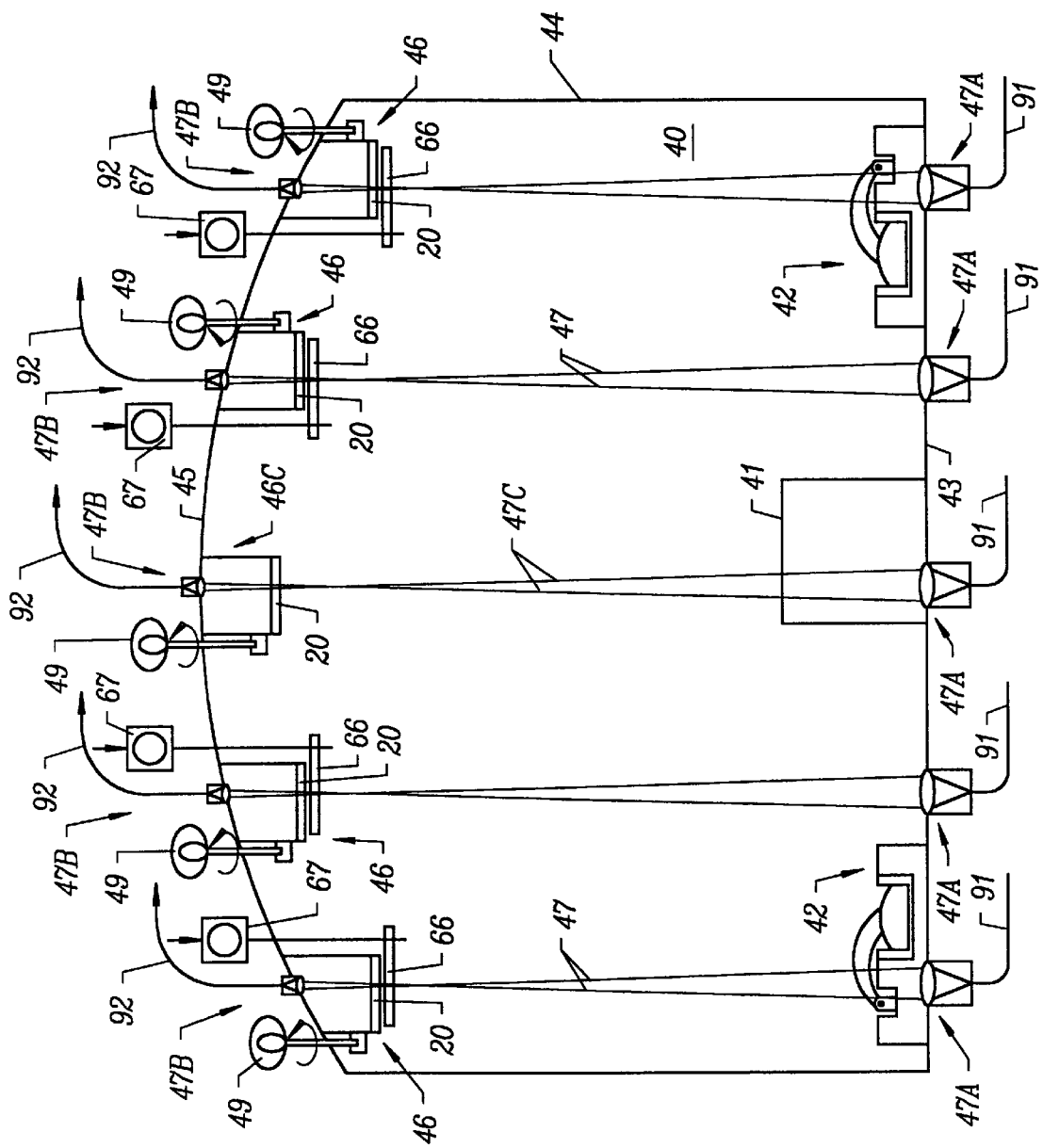
FIG. 3 is a representative cross-sectional view of a vacuum chamber of an optical coating system according to the present invention.

The present invention addresses the seemingly contradictory demands for a high production optical coating system and a system with precision and controlled optical coating thicknesses. A vacuum chamber 40 in accordance with the present invention is shown in FIG. 3. The chamber 40 is similar to the chamber 10 shown in FIG. 1. The base 43 has a plasma source 41 near the center of the base 43 and a plurality of e-beam evaporation units 42 located around the circular periphery of the base 43. Rather than a single substrate holding station, a plurality of slave substrate holding stations 46 are fixed around the top 45 of the chamber 40 with a single master station 46C at the center of the top 45. The slave stations 46 are arranged with respect to the e-beam evaporation units 42 so that the substrates 20 held in these stations receive coating material more quickly than the substrate in the center master station 46C.

Each slave station 46, but not the master station 46C, has a shutter 66 which, when closed, blocks the coating material from reaching the substrate 20 held by the station 46. An actuator 67 in each station 46 provides the motive power to move the corresponding shutter 66. The shutter 66 allows station-by-station control over the deposition thickness of the coating material.

Associated with each slave substrate holding station 46 is a slave light monitoring unit 47 to monitor in-situ the coating material thicknesses on its corresponding substrate 20. The master substrate holding station 46C has a master light monitoring unit 47C. Each monitoring unit 47 (including the master monitoring unit 47C) has two parts, 47A and 47B. Each lower part 47A, which is attached to the base 43 of the chamber 40, directs light upon the substrate 20 of its corresponding holding station 46, 46C. The light passes through the substrate 20 and is received by the upper portion 47B of the light monitoring unit and into an optical fiber 92 which is connected to a control unit described below.

Figure 4A:
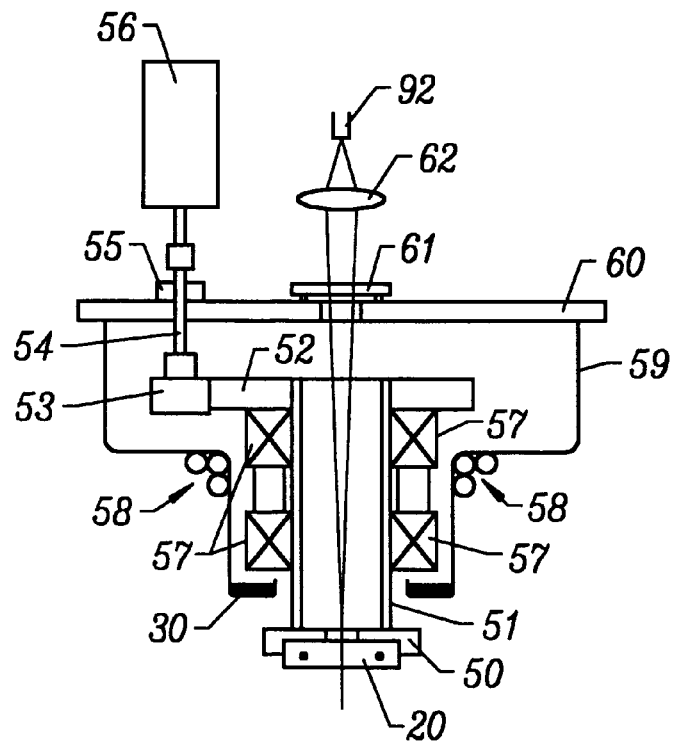
FIG. 4A is a more detailed diagrammatic view of a substrate holding station of the optical coating system of FIG. 3.

FIG. 4A is a representative cross-sectional and more detailed view of a substrate holding station 46 (and 46C). A chuck 50, which holds the substrate 20, is mounted to one end of a hollow shaft 51. A bearing subassembly 57 allows the shaft 51 to rotate with respect to stationary parts of the substrate holding station 46, 46C. The other end of the shaft 51 ends in a large gear 52, which is driven by a small drive gear 53. The drive gear 53 is connected by a drive shaft 54 to a motor 56. The motor 56 is outside the top wall 60 of the chamber 40 and a feedthrough 55 provides vacuum-proof access for the drive shaft 54. The center axis of the holding station 46 is designed to permit passage of light for the monitoring unit 47. The center of the chuck 50 is open, as well as the shaft 51. The top wall 60 has an opening aligned on this axis and the vacuum in the chamber 40 is protected by a transparent seal 61 over the opening. Light from the lower monitoring unit 47A passes through the substrate 20, the shaft 51 and the seal 61 into the optical fiber 92 by the focusing action of a lens 62.

The arrangement of the light monitoring unit 47 with respect to its corresponding substrate holding station 46, 46C is one of many improvements made to respond to the strict manufacturing requirements of an optical element, such as a narrow bandpass filter, according to the present invention.

In the first place, while other kinds of sources, such as laser diodes, LEDs, erbium-doped fiber amplifiers, may be used as a light source, a conventional halogen lamp is used because of its power stability, polarization properties, and short coherent length. A monochromator narrows wavelength bandwidth which is required for the precise determination of the coating thickness. With the described light source, a 0.2 nm wavelength bandwidth can been achieved without lowering the accuracy of the transmission measurement through the substrate 20.

Secondly, the effective wavelength bandwidth of the light monitoring unit 47 is adversely affected by the non-uniform thickness of the optical coating within the monitoring light spot on the substrate 20. The arrows 35 define a monitoring spot on the substrate in FIG. 2, for example. If the non-uniformity of the optical coating thickness leads to a bandwidth of 0.1 nm per each millimeter across the substrate, a monitoring light spot of 2 mm in diameter yields an effective bandwidth due to thickness non-uniformity of 0.2 nm. Hence a small monitoring light spot on the substrate 20 is used to reduce the bandwidth caused by the non-uniform thickness.

Thirdly, because light from the lower monitoring unit 47A is focused to obtain a small monitoring spot on the substrate 20, the light incident upon the surface of the substrate 20 spans a small range, usually 1 to 2 degrees (indicated by the arc 36 in FIG. 2). If the average incident angle is not zero, such as in the FIG. 2 arrangement, a relatively large effective bandwidth is created due to the varying angles at which the light approaches the substrate 20. For example, a 5 degree average incident angle with a 1 degree incident angle span has an effective bandwidth larger than 0.5 nm. This linewidth reduces to less than 0.2 nm if the average incident angle is zero, i.e., the light is, on average, normal to substrate 20, as in the monitoring unit 47.

Thus each monitoring unit 47 (and 47C) operates with an effective light source, minimized monitoring spot size, and the average angle of incidence is normal upon the substrate 20.

Another feature of the present invention is the rotation of the substrate 20 at each holding station 46 and 46C at speeds much greater than found in previous optical coating systems. Higher rotation speeds, from 600 to 1200 rpm (revolutions per minute), improve the thickness distribution of the coatings across the substrate 20. It is understood that rotation averages the thickness distribution on the substrate 20 radially and one complete rotation performs a perfect average. If the coating of each layer on the substrate 20 is terminated at complete revolutions, then the influence of rotation speed upon thickness distribution is avoided. However, in actual practice, such is not the case and a coating is not terminated at complete revolutions. Higher rotation speeds reduces this effect.

Another benefit of higher rotation speeds is an improvement in the stability in the monitoring light signal levels. In varying degrees, there are always fluctuations in the light signal caused by vibration and wobbling of the rotating substrate 20. The high speed rotations average the signal levels and help stabilize the light signal.

To achieve higher rotation speeds is not simply a matter of increasing the rotation of a drive unit (e.g., the drive unit 19 in FIG. 3). Due to the sensitivity of the coating process, stability of the substrates 20 at high speed rotation is very important. Special bearing arrangements and cooling for the slave and master substrate holding stations 46 and 46C permit rotations at high speeds with the stability required for an optical coating process. In FIG. 4A, a bearing subassembly 57 is symbolically represented as separated into upper and lower parts to indicate a pair of ball bearings.

Figure 4B:
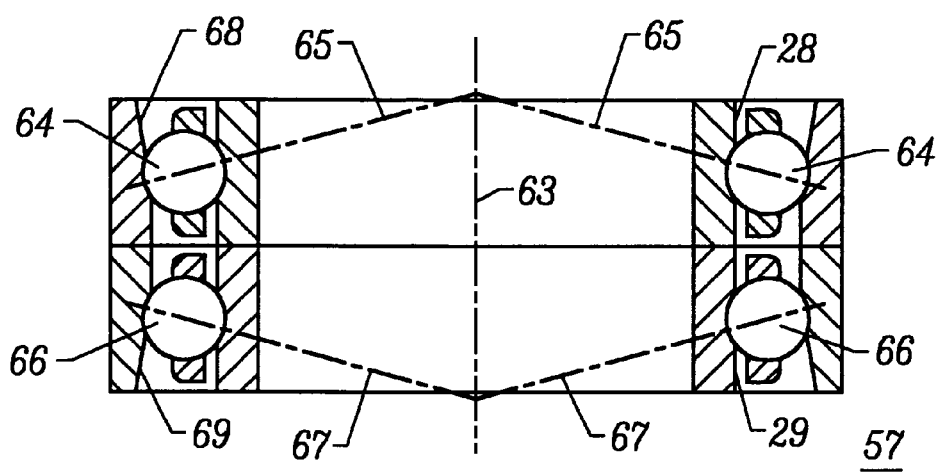
FIG. 4B is a detailed view of the arrangement of the rotation bearings in the substrate holding station of FIG. 4.

The detailed arrangement of the bearing assembly 57 is shown in FIG. 4B. The drive shaft 51 is supported within a housing 59 by a pair of angular contact ball bearings 64 and 66. The ball bearings 64, 66 respectively engage outer races 68, 69, which are fixed with respect to the stationary housing 59, and inner races 28, 29, which are fixed with respect to the rotating shaft 51. The outer race 68 is angled upward as shown by the dotted lines 65; the outer race 69 is angled downward as shown by the dotted lines 67. The angular contact ball bearings 64, 66 are used in this back-to-back arrangement so they can accommodate combined axial, thrust and moment loads. Also, the back-to-back arrangement has better shaft stiffness.

Additionally, because of the high-speed environment, it is desired to keep bearings 66, 68 cool. This is provided by the use of coolant channels 58 intimately connected to the housing 59 near the bearings 64, 66. Heat shields 30 are also used to help maintain the temperature of bearings 64, 66 at a reasonable level.

Figure 5:
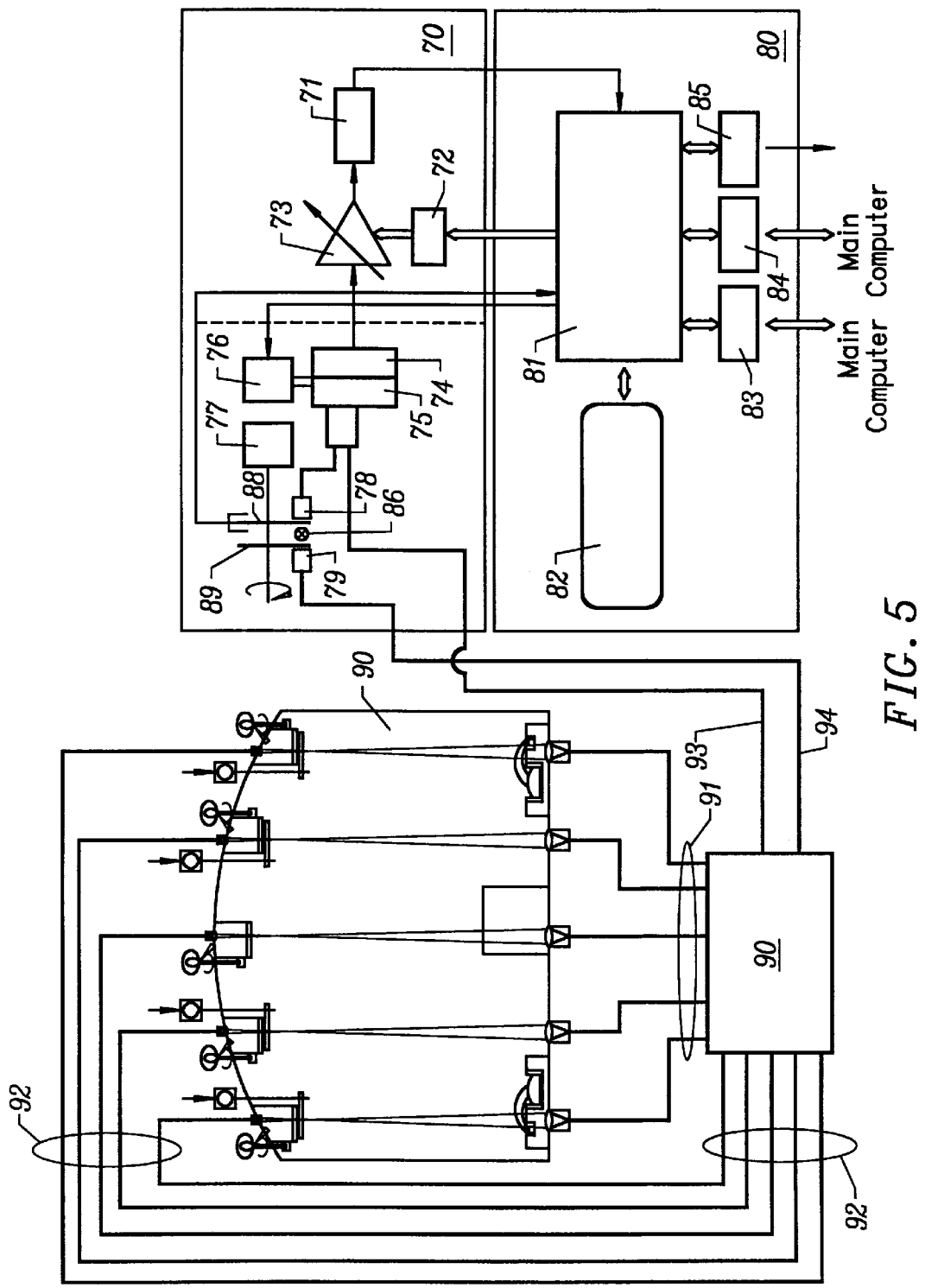
FIG. 5 is a representative view of the FIG. 3 optical coating system, including control and light monitoring subsystems.

FIG. 5 illustrates the control organization of the coating system according to the present invention. In one embodiment, the control organization has a fiberoptic switch 90, an electro-optical analysis unit 70, and a control unit 80. As the name implies, the fiberoptic switch 90 operates as a switching point of optical signals between the vacuum chamber 40 and the electro-optical analysis unit 70. The unit 70, in turn, operates as an interface between optical signals for the vacuum chamber 40 and the electrical signals for the control unit 80.

The fiberoptic switch 90 is connected by two optical fibers 91 and 92 to each slave and master light monitoring unit 47, 47C in the chamber 40. The optical fiber 91 carries light from a light source to the lower portion 47A and the optical fiber carries light from the upper portion 47B for detection and analysis. The switch 90 is connected by optical fibers 93 and 94 to the electro-optical analysis unit 70. The optical fiber 94 carries light from the unit 70 to the switch 90 and the optical fiber 93 carries light from the switch 90 to the unit 70. An exemplary fiberoptic switch which could be used is described in U.S. Pat. No. 5,359,683, which issued Oct. 25, 1994 and is assigned to the present assignee. Fiberoptic switches can also be obtained from various commercial sources.

The electro-optical analysis unit 70 has a light source 86, a conventional halogen lamp, between two rotors 88 and 89 which are driven by a chopper motor 77. The rotors 88, 89 have slots which transmit light. Otherwise, light is blocked. A lens subassembly 79 is connected to the optical fiber 94 to focus light from the source 86 into the fiber 94. A second lens subassembly 78 is connected to a section of optical fiber which, in turn, is connected to a monochromator 75. The end of the optical fiber 93 is also connected to the monochromator 75, which is controlled by a step motor 76, to narrow the wavelength bandwidth of the light received through the fiber 93. The output of the monochromator 75 is received by a photodiode 74 which is connected to the input terminal of a variable gain amplifier 73 which is responsive to a gain switch 72. The output of the amplifier 73 is connected to signal processing electronic unit 71 which has its output connected to the control unit 80 which controls the operation of the electro-optical analysis unit 70.

The operation of the rotors 88, 89 and the chopper motor 77 is such that in one time interval, light is sent to the lens subassembly 79 and the optical fiber 94 to a light monitoring unit 47, 47C. After passing through the corresponding substrate 20 and deposited film(s), the light passes through the optical fiber 93 to the monochromator 75 and photodiode 74. At a second time interval, light to the lens subassembly 79 is blocked. Light is sent to the lens subassembly 78 and the photodetector 74 receives a reference light signal. At a third interval, none of the subassemblies 78, 79 receive light from the source 86. The photodetector 74 generates dark noise. This operation permits calibration and noise removal for the signals from the light monitoring units 47 for an accurate and stable measurement of the transmissivity. Of course, other arrangements are possible.

The control unit 80 has a microprocessor 81 which accepts the output signals from the electronic unit 71 and which controls the gain switch 72 and the stepper motor 76. Control of the gain switch 72 is used to compensate for the variation in the output signal from the photodiode 74 in the different stages of the coating process. The microprocessor 81 interacts with human operators through a display and control panel 82, and communicates with other computers, such as a main computer, by a serial I/O port 83, parallel I/O port 84. The microprocessor 81 also has a recorder output port 85 so that the data of all the coating operations can be recorded for later reference.

The microprocessor also controls the operation of fiberoptic switch 90 so that light is sent from, and received by, the electro-optical analysis unit 70 to each of the light monitoring units 47 sequentially. When the microprocessor 81 determines that the thickness of the optical coating on a particular substrate 20 is sufficient, the microprocessor engages the actuator 67 of that substrate holding station 46 to close the corresponding shutter 66. No more coating material is deposited on that substrate 20. By the location of the center station 46C, the deposition coating of its substrate 20 is the last to be completed. Instead of actuating a shutter 66, the microprocessor 81 sends a signal to the main computer of the coating machine to terminate the deposition coating of that layer. Then a new layer of coating begins. If all the layers are completed, then the coating process is terminated.

An alternative control arrangement removes the fiberoptic switch 90 and has the optical fiber 94 connected to the fiber 91 and the fiber 92 to the fiber 93. Each substrate holding station 46, 46C and light monitoring unit 47, 47C has its own electro-optical analysis unit 70 and a control unit 80. Overall control is performed by a main computer connected to each one of the control units 80. The alternative control arrangement, while more costly, recognizes that a fiberoptic switch 90 is very likely to create an insertion loss variation in switching between light monitoring units 47, 47C. If the insertion loss variation is as large as 0.01 dB, this creates a transmission measurement error of 0.3%, too large for critical optical elements, such as the narrow bandpass filter. Without a fiberoptic switch, transmission measurement error is expected to be less than 0.05%.

Figure 6:
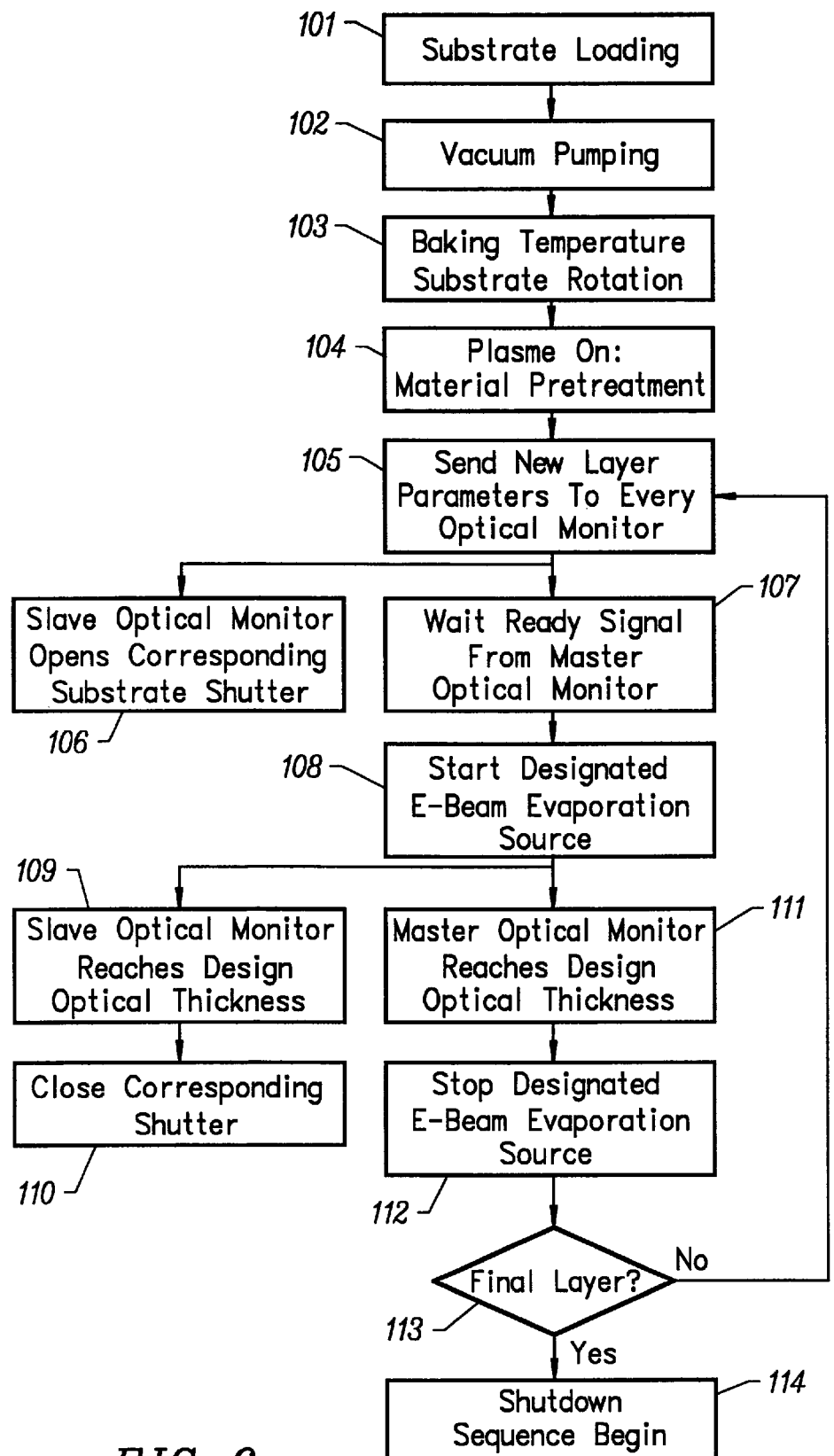
FIG. 6 is a flow chart of operations of the optical coating system of FIG. 3.

FIG. 6 is a flow chart of operations of the optical coating system of FIG. 3. After the start step 100, the substrates are loaded into their substrate holding stations 46, 46C by step 101. A vacuum is then created in the chamber 40 by step 102; step 103 raises the temperature in the chamber 40 to bake off moisture and other impurities. This step can be performed by resistive heating elements around the chamber 40. The rotation of the substrates is started. The plasma unit 41 is turned on by step 104 and any pretreatment of the coating material occurs. In step 105, new layer parameters for the layer to be deposited become operative. In the alternative control organization embodiment, the new parameters are sent to the control units 80 for each of optical monitoring units 47, 47C. Step 106 opens the shutters 66 for the slave substrate holding stations 46, while a ready signal is awaited from the master optical monitoring unit 47C. Then step 108 starts an e-beam evaporation unit 42 and steps 109 and 111 are started simultaneously, i.e., the slave optical monitoring units 47 and the master optical monitoring unit 47C check whether the desired thickness of the deposited optical layer has been reached on the corresponding substrate 20. Shown as single steps 109 and 111, these steps are actually performed in monitoring loops. When the desired thickness is reached, the corresponding shutter 66 of the slave substrate holding station 46 is closed by step 110. As mentioned previously, the desired thickness of the master substrate holding station 46C is the last to be reached. Step 112 stops the e-beam evaporation unit 42. Decision step 113 determines whether the deposited optical layer is the last layer or not. If not, the steps 105–113 are repeated for the deposition of another layer. If the last layer has been reached a shutdown sequence is started by step 114.

To meet the stringent requirements of thickness uniformity from one deposited layer to the next, the e-beam target should be fresh, i.e., not used previously, at the start of each layer deposition process. This uniformity in the target for each layer assures uniformity in the deposition from layer to layer. This can be performed by changing the target after each deposition process is completed if only one e-beam evaporation unit 42 is used. If there is more than one e-beam evaporation unit 42, a second unit with a fresh target can be used for the next deposition layer. Alternatively, if the e-beam evaporation unit is a carousel-type with many targets, the carousel can be rotated to present a fresh target at the beginning of each deposition layer cycle.

The result is that the present invention provides for a high-volume optical coating system with precision control over the thicknesses of the optical coatings.

While the description above provides a full and complete disclosure of the preferred embodiments of the present invention, various modifications, alternate constructions, and equivalents will be obvious to those with skill in the art. For example, it should be evident that while the specific embodiment of the present invention was described with plasma-assisted, e-beam evaporation units as coating material sources, other types of evaporation units and sputtering units, may also be used. Thus, the scope of the present invention is limited solely by the metes and bounds of the appended claims.

What is claimed is:

1. A high-volume apparatus for precision coating substrates to form optical elements, said system comprising:
    a vacuum chamber;
    at least one optical coating material source for generating coating material vapor for deposition;
    a plurality of stations, each station holding and rotating a substrate to receive said optical coating material by deposition of said coating material vapor from said optical coating material source; and
    a plurality of optical monitoring units, each optical monitoring unit corresponding to one of said stations for monitoring said deposition of said coating material upon said corresponding substrate.

2. The optical coating apparatus of claim 1 wherein each optical monitoring unit comprises
    a source of light directed at a small portion of a surface of said substrate of said corresponding station; and
    a receiver of said directed light, said substrate between said source of light and said receiver so that said receiver receives said light during said deposition of said optical coating material upon said corresponding substrate.

3. The optical coating apparatus of claim 2 wherein said source of light is arranged to direct light at a zero averaged angle of incidence to said surface of said substrate upon which said coating is deposited.

4. The optical coating apparatus of claim 3 wherein said light source comprises a first optical fiber and a first lens focusing light from one end of said first optical fiber upon said surface of said substrate; and said receiver comprises a second optical fiber and a second lens focusing said directed light from said substrate to an end of said second optical fiber.

5. The optical coating apparatus of claim 1 wherein at least one station comprises a means for stopping said deposition of said coating material upon said corresponding substrate, said stopping means responsive to an output of said corresponding optical monitoring unit.

6. The optical coating apparatus of claim 5 wherein said stopping means comprises a shutter which prevents said coating material from reaching said substrate.

7. The optical coating apparatus of claim 1 wherein said optical material coating source comprises a sputtering source.

8. The optical coating apparatus of claim 1 wherein said optical material coating source comprises an evaporation source.

9. The optical coating apparatus of claim 8 wherein said evaporation source comprises plasma-assisted, e-beam evaporation source.

10. The optical coating apparatus of claim 1 wherein said vacuum chamber comprises a base and a top, said optical material coating source mounted on said base, and said stations mounted on said top with respect to said optical material coating source such that optical coating material is deposited on a substrate held in a first station at a rate lower than an optical material deposition rate on a substrate at any other substrate station.

11. The optical coating apparatus of claim 10 wherein said vacuum chamber is rotationally symmetric about a central axis, and comprising a plurality of optical material coating sources located around a periphery of said base, said first station on said central axis.

12. A high-volume apparatus for precision coating substrates to form optical elements, said system comprising:
   a vacuum chamber;
   at least one optical coating material source for generating coating material vapor for deposition;
   a plurality of stations, each station holding and rotating a substrate to receive said optical coating material by deposition of said coating material vapor from said optical coating material source; and
   a plurality of optical monitoring units, each optical monitoring unit corresponding to one of said stations for monitoring deposition of said coating material upon said corresponding substrate, each of said stations independently terminating deposition of said coating material on said corresponding substrate responsive to said optical monitoring unit.

13. The optical coating apparatus of claim 12 wherein each optical monitoring unit comprises:
   a source of light directed at a small portion of a surface of said substrate of said corresponding station; and
   a receiver of said directed light, said substrate between said source of light and said receiver so that said receiver receives said light during said deposition of said optical coating material upon said corresponding substrate.

14. The optical coating apparatus of claim 13 wherein said source of light is arranged to direct light at a zero averaged angle of incidence to said surface of said substrate upon which said coating is deposited.

15. The optical coating apparatus of claim 14 wherein said light source comprises a first optical fiber and a first lens focusing light from one end of said first optical fiber upon said surface of said substrate; and said receiver comprises a second optical fiber and a second lens focusing said directed light from said substrate to an end of said second optical fiber.

16. The optical coating apparatus of claim 12 wherein said station means comprises a shutter to terminate deposition of said coating material on said substrate.

17. The optical coating apparatus of claim 12 wherein said optical material coating source comprises a sputtering source.

18. The optical coating apparatus of claim 12 wherein said optical material coating source comprises an evaporation source.

19. The optical coating apparatus of claim 18 wherein said evaporation source comprises plasma-assisted, e-beam evaporation source.

20. The optical coating apparatus of claim 12 wherein said vacuum chamber comprises a base and a top, said optical material coating source mounted on said base, and said stations mounted on said top with respect to said optical material coating source such that optical coating material is deposited on a substrate held in a first station at a rate lower than an optical material deposition rate on a substrate at any other substrate station.

21. The optical coating apparatus of claim 20 wherein said vacuum chamber is rotationally symmetric about a central axis, and comprising a plurality of optical material coating sources located around a periphery of said base, said first station on said central axis.

22. A high-volume apparatus for precision coating substrates to form optical elements, said system comprising:
   a vacuum chamber;
   at least one optical coating material source for generating coating material vapor for deposition;
   a plurality of stations, each station holding and rotating one substrate about a central axis of said substrate to uniformly receive said optical coating material by deposition of said coating material vapor from said optical coating material source; and
   a plurality of optical monitoring units, each optical monitoring unit corresponding to one of said stations for monitoring deposition of said coating material upon said corresponding substrate.

23. The optical coating apparatus of claim 22 wherein each optical monitoring unit comprises
   a source of light directed at a small portion of a surface of said substrate of said corresponding station; and
   a receiver of said directed light, said substrate between said source of light and said receiver so that said receiver receives said light during said deposition of said optical coating material upon said corresponding substrate.

24. The optical coating apparatus of claim 23 wherein said source of light is arranged to direct light at a zero averaged angle of incidence to said surface of said substrate upon which said coating is deposited.

25. The optical coating apparatus of claim 24 wherein said light source comprises a first optical fiber and a first lens focusing light from one end of said first optical fiber upon said surface of said substrate; and said receiver comprises a second optical fiber and a second lens focusing said directed light from said substrate to an end of said second optical fiber.

26. The optical coating apparatus of claim 22 wherein said station means comprises a shutter to terminate deposition of said coating material on said substrate.

27. The optical coating apparatus of claim 22 wherein said optical material coating source comprises a sputtering source.

28. The optical coating apparatus of claim 22 wherein said optical material coating source comprises an evaporation source.

29. The optical coating apparatus of claim 28 wherein said evaporation source comprises plasma-assisted, e-beam evaporation source.

30. The optical coating apparatus of claim 22 wherein said vacuum chamber comprises a base and a top, said optical material coating source mounted on said base, and said stations mounted on said top with respect to said optical material coating source such that optical coating material is deposited on a substrate held in a first station at a rate lower than an optical material deposition rate on a substrate at any other substrate station.

31. The optical coating apparatus of claim 30 wherein said vacuum chamber is rotationally symmetric about a central axis, and comprising a plurality of optical material coating sources located around a periphery of said base, said first station on said central axis.

* * * * *